United States Patent [19]

Coupard et al.

[11] Patent Number: 4,823,523
[45] Date of Patent: Apr. 25, 1989

[54] ELECTROMAGNETIC RADIATION SHIELDING ENCLOSURE AND SHIELDING COMPONENTS

[75] Inventors: Donald N. Coupard, 8001 Overhill Dr.., Bethesda, Md. 20814; Andrew K. Chang, 11731 Glen Mill Rd., Potomac, Md. 20854; John E. Fuller, 4415 Brookeville Rd., Brookeville, Md. 20853; Angelo Mauriello, 1232 Hilltop Rd., Southampton, Pa. 18966

[73] Assignees: Donald N. Coupard, Bethesda; Andrew K. Chang, Potomac; John E. Fuller, Brookeville, all of Md.; Angelo J. Mauriello, Southampton, Pa. ; a part interest

[21] Appl. No.: 150,286

[22] Filed: Jan. 29, 1988

Related U.S. Application Data

[63] Continuation of Ser. No. 1,225, Jan. 6, 1987.

[51] Int. Cl.[4] .............................................. E04B 2/02
[52] U.S. Cl. ..................................... 52/173 R; 52/33; 52/79.6; 52/204; 52/741
[58] Field of Search ................. 52/173 R, 204, 22, 33, 52/741, 79.6; 109/1 R, 15, 24, 49.5, 82, 84, 35, 85; 174/35 MS

[56] References Cited

U.S. PATENT DOCUMENTS

| | | | |
|---|---|---|---|
| 1,780,108 | 10/1930 | Barry | 109/84 X |
| 2,870,439 | 1/1959 | Stinehelfer | 174/35 MS X |
| 3,092,218 | 6/1963 | Clay | 174/35 MS X |
| 3,217,085 | 11/1965 | Lindgren | 174/35 MS |
| 3,229,429 | 1/1966 | Conrad | 52/173 R X |
| 3,246,072 | 4/1966 | Lindgren | 174/35 MS |
| 3,334,597 | 8/1967 | Ruskin et al. | 109/1 S |
| 3,340,587 | 9/1967 | Beyer | 174/35 MS |
| 3,517,627 | 6/1970 | Kruse | 109/82 |
| 3,745,226 | 7/1973 | Nichols et al. | 174/35 MS |
| 3,885,084 | 5/1975 | Kuisersweath | 174/35 MS |
| 4,068,087 | 1/1978 | Ristig | 74/35 MS |
| 4,115,656 | 9/1978 | Aitel | 52/67 X |
| 4,454,692 | 6/1984 | Ault | 52/451 X |
| 4,523,528 | 6/1985 | Hastings et al. | 109/85 |

FOREIGN PATENT DOCUMENTS

| | | | |
|---|---|---|---|
| 2419792 | 11/1975 | Fed. Rep. of Germany | 124/35 MS |
| 787915 | 7/1935 | France | 109/49.5 |
| 542587 | 1/1942 | United Kingdom | 52/204 |

*Primary Examiner*—Carl D. Friedman
*Attorney, Agent, or Firm*—Burns, Doane, Swecker & Mathis

[57] ABSTRACT

A shielding enclosure for preventing propagation of electromagnetic radiation into or out of the enclosure comprising a support structure and a plurality of sheets of electrically conductive material supported thereon. Each of the sheets has an edge extending therearound and a region of overlap extending inwardly of and along the edge. The region is in overlapping engagement with the region of overlap of sheets adjacent thereto on the support structure so as to define a wave guide gap. Adjacent sheets are pressed together by pressure plates at the overlapping regions to maintain a gap width through which the electromagnetic radiation cannot propagate. Shielding components used to construct a shielding enclosure are also disclosed.

15 Claims, 11 Drawing Sheets

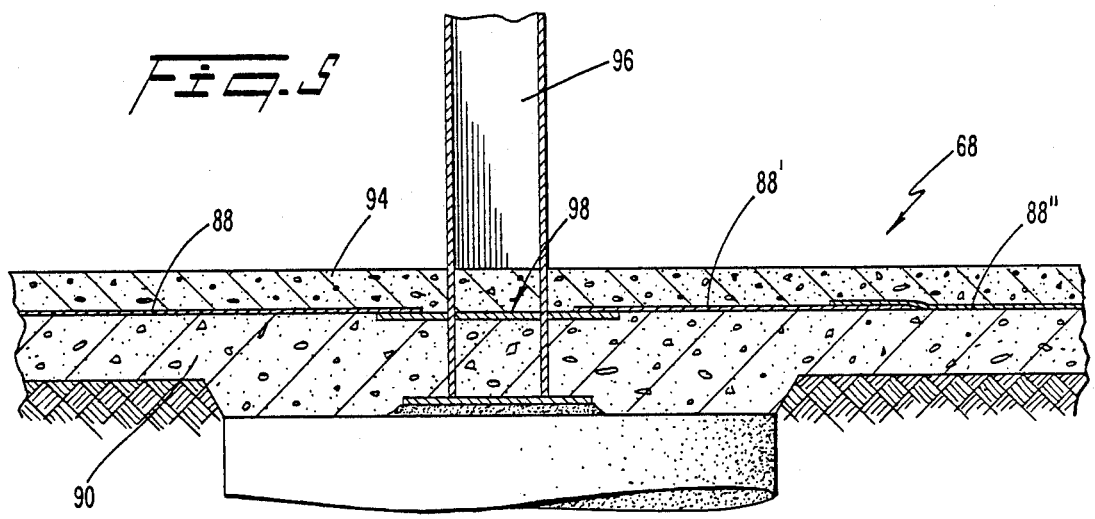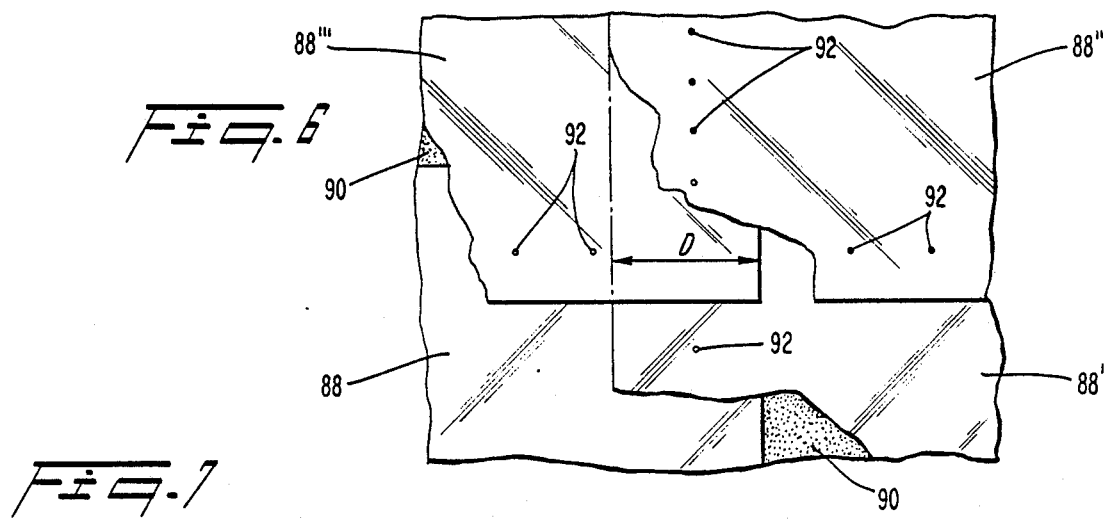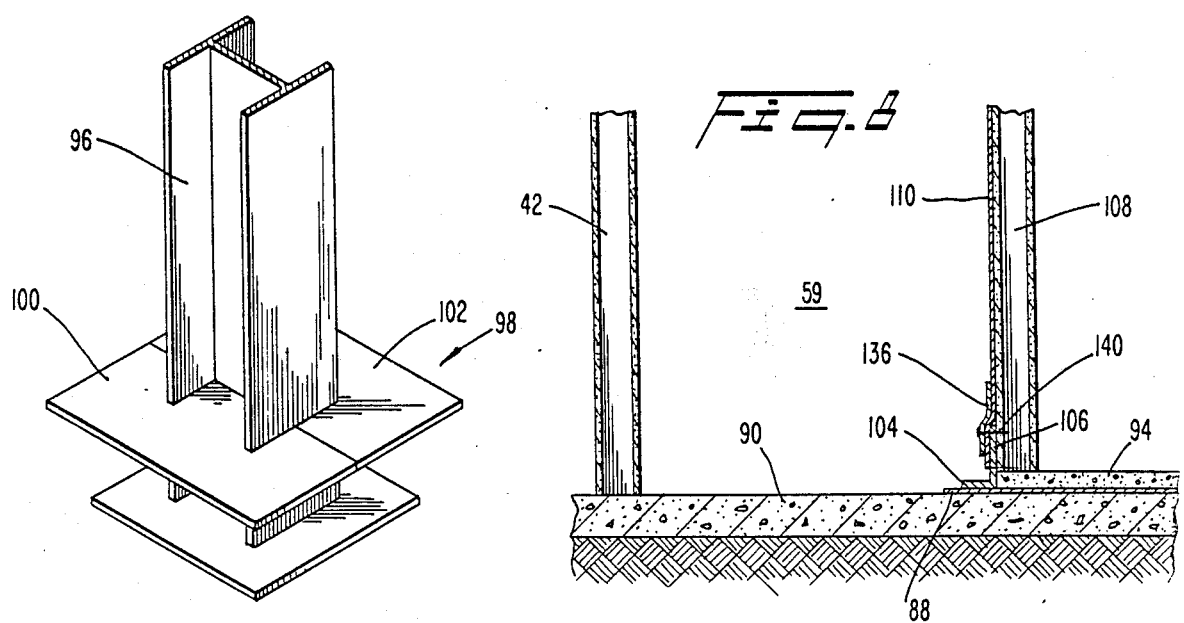

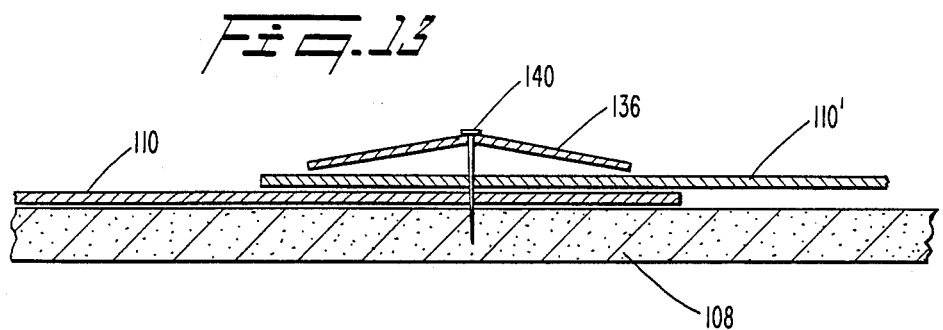
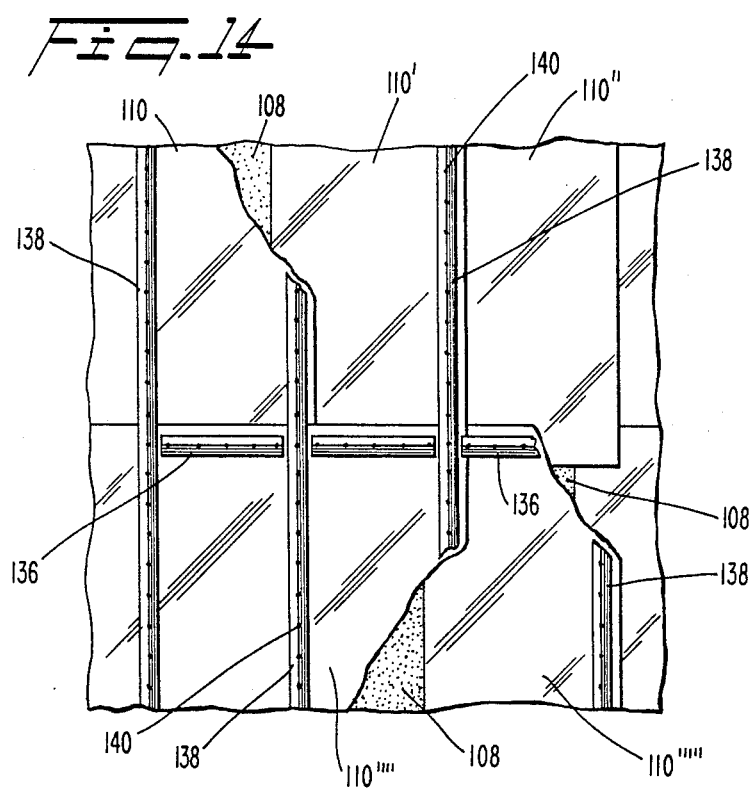
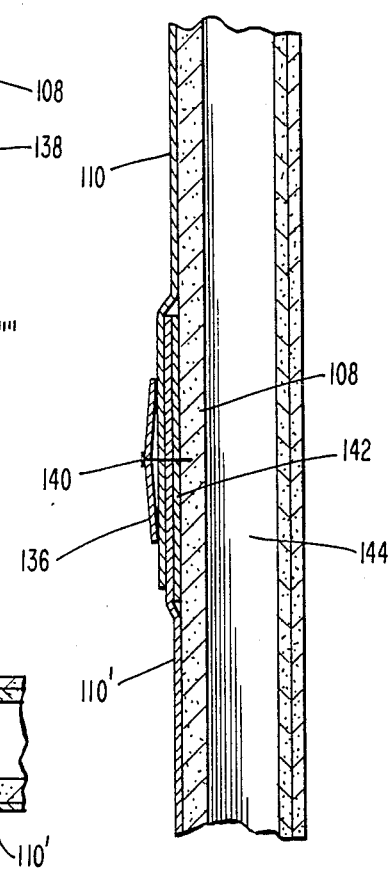
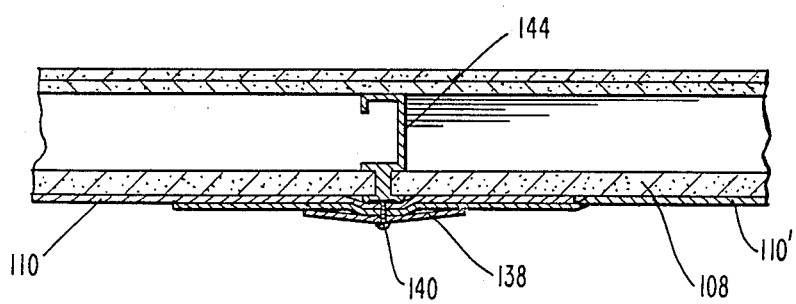

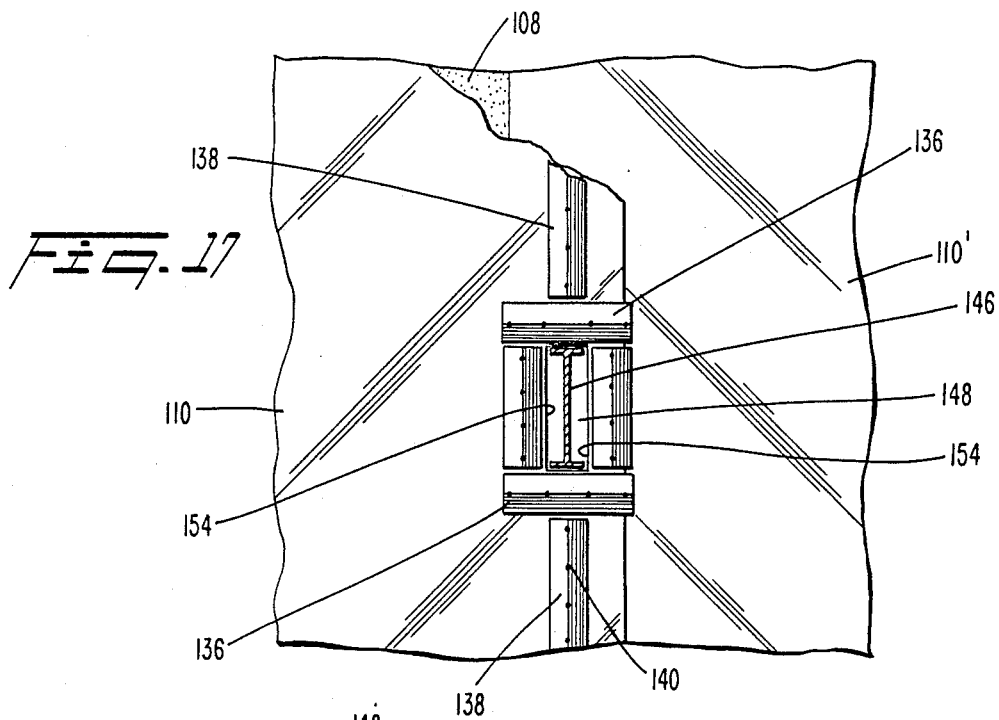
Fig. 17
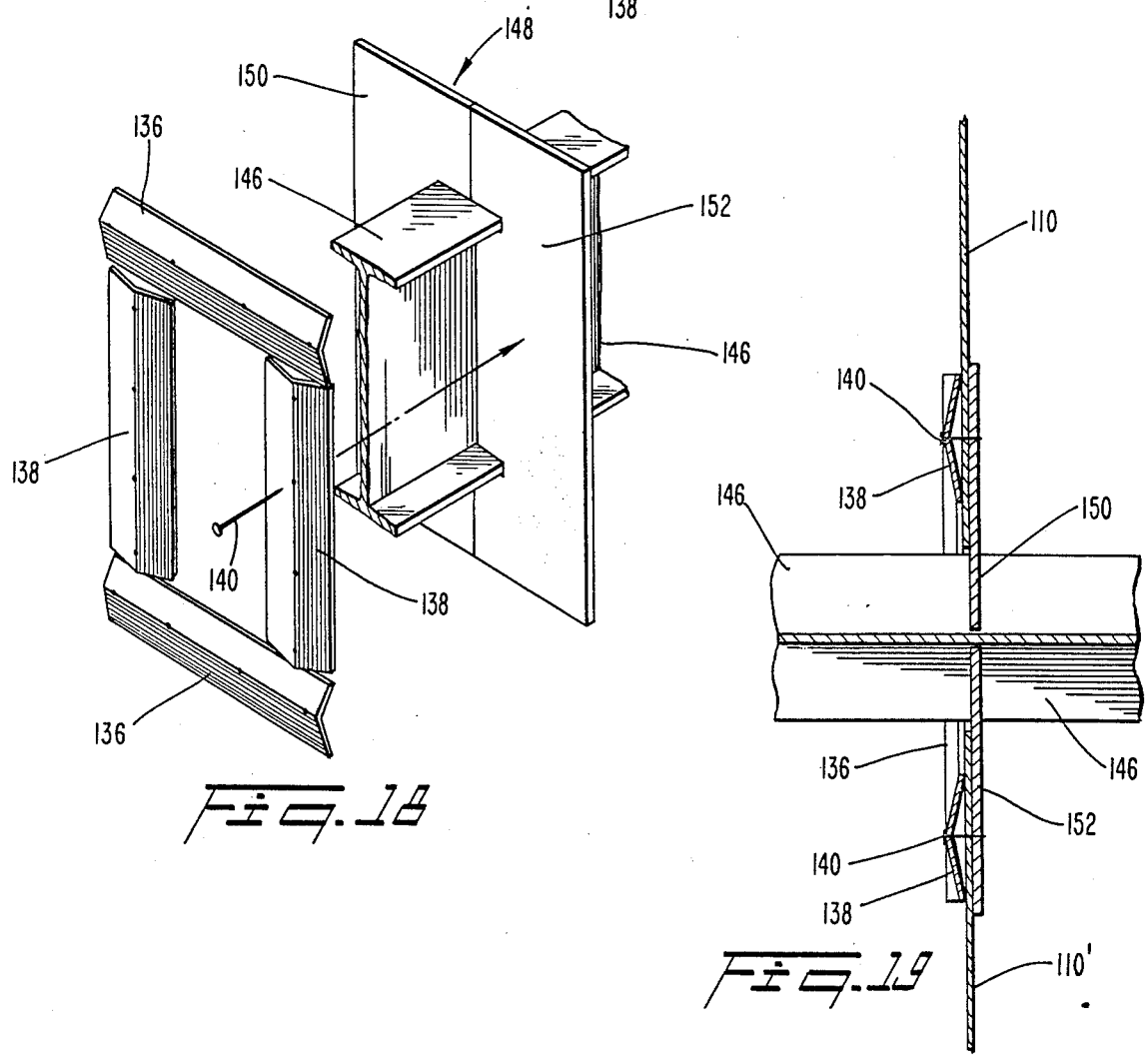
Fig. 18
Fig. 19

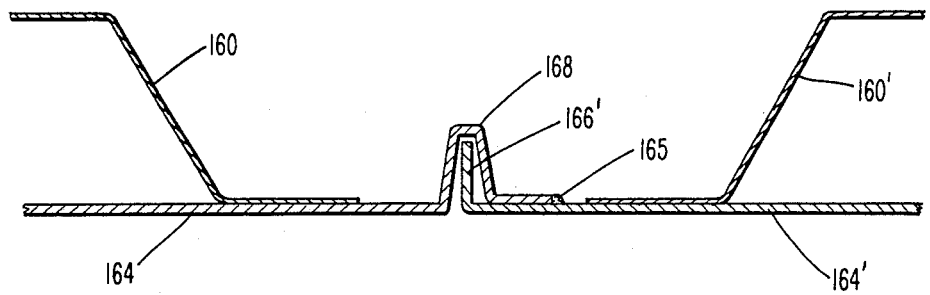
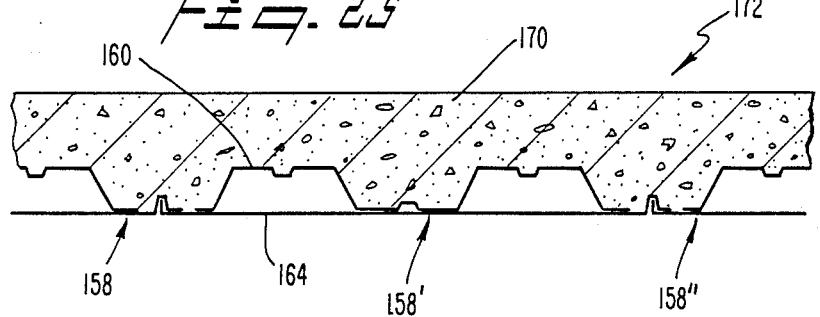
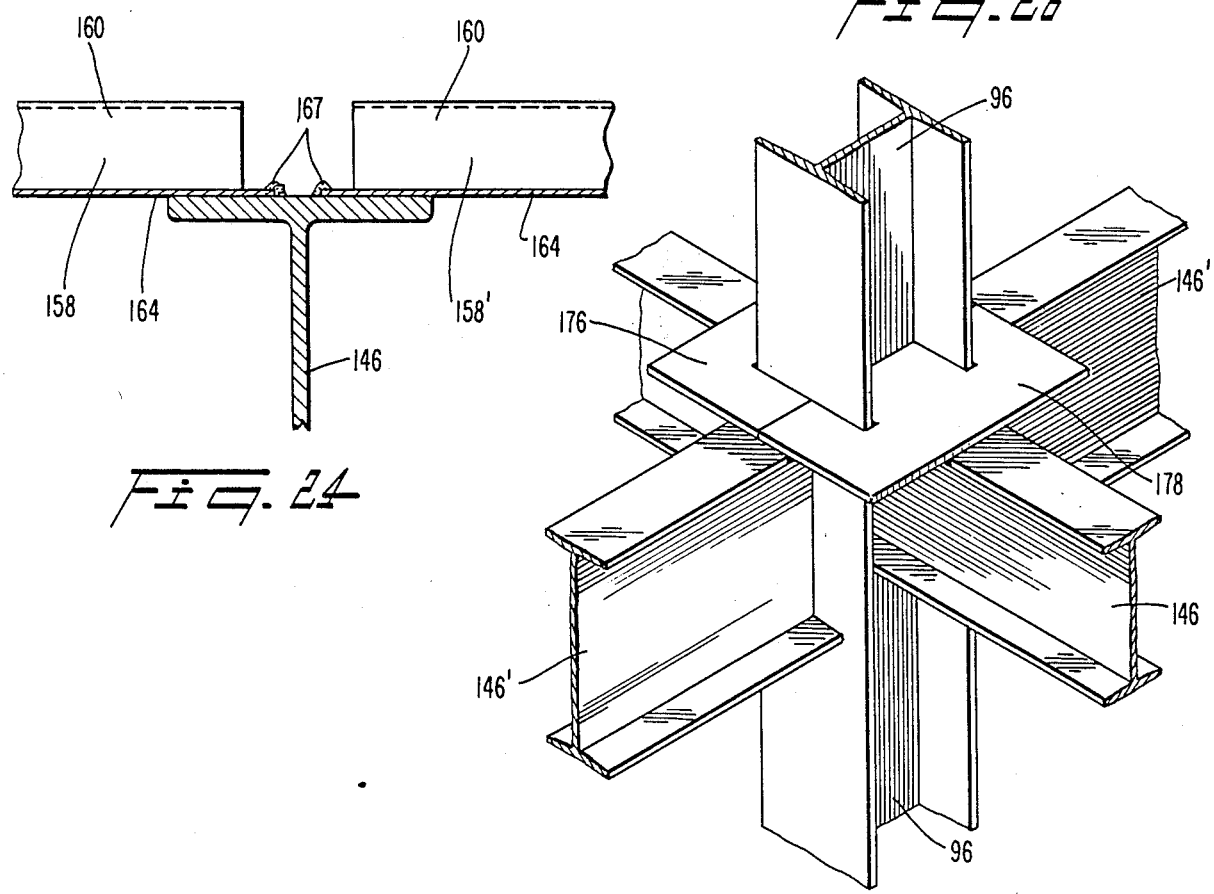

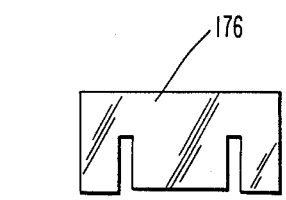
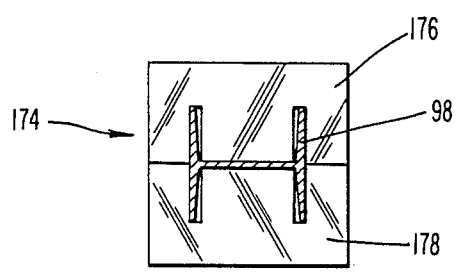
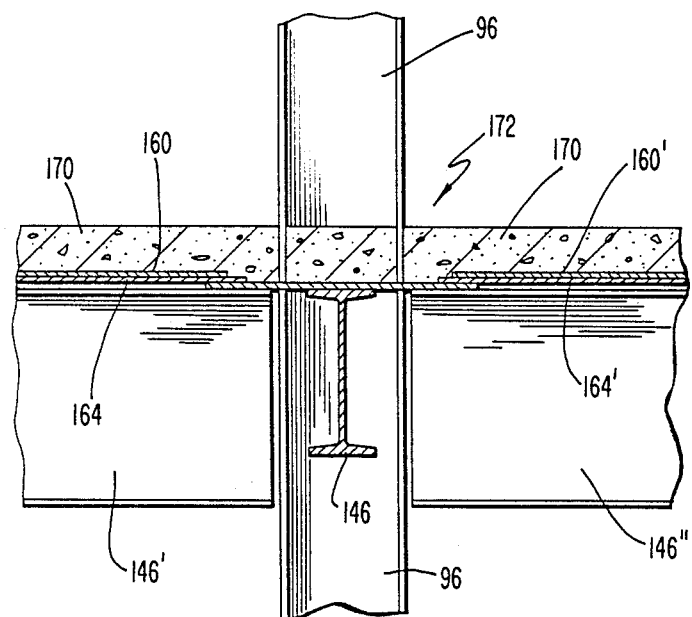
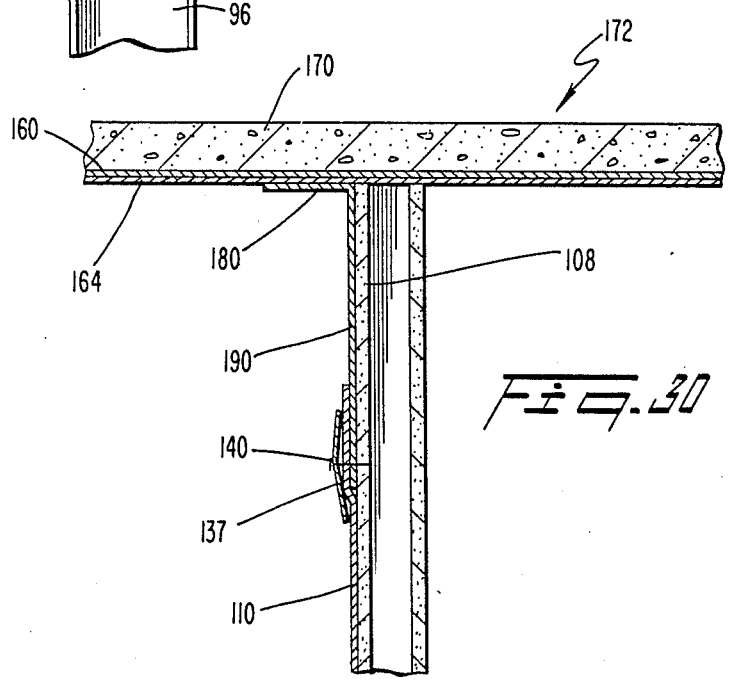

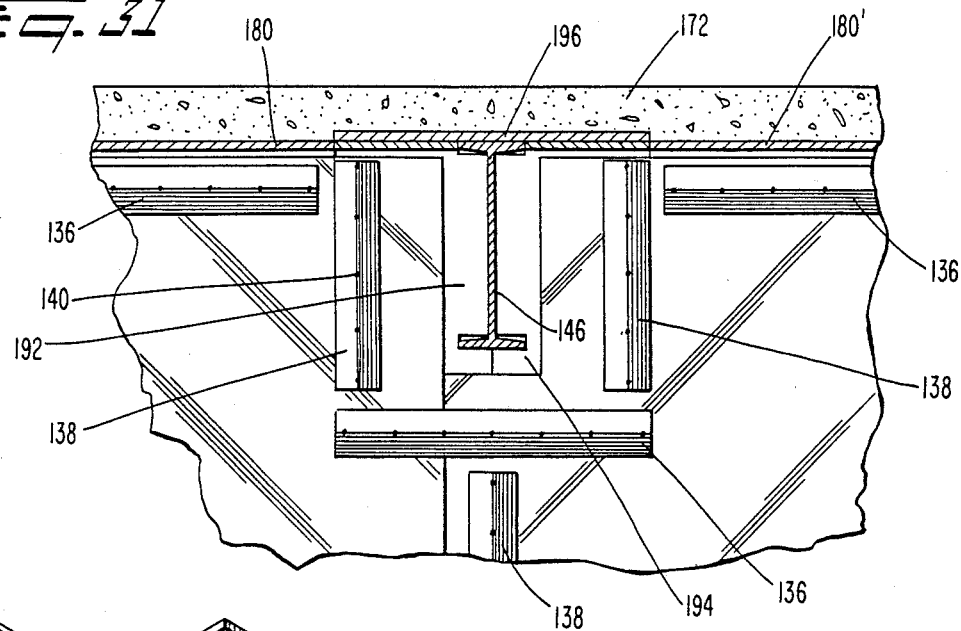
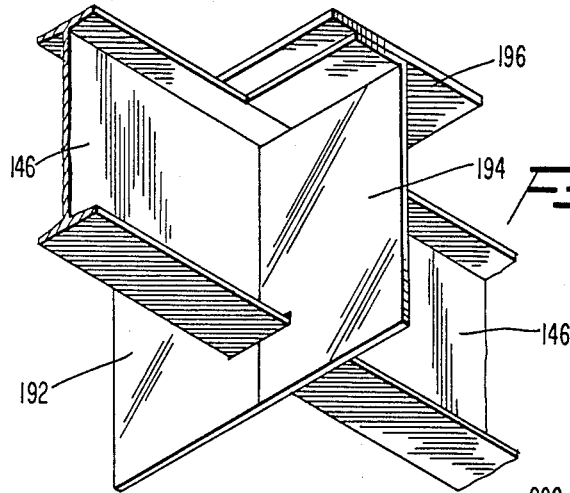
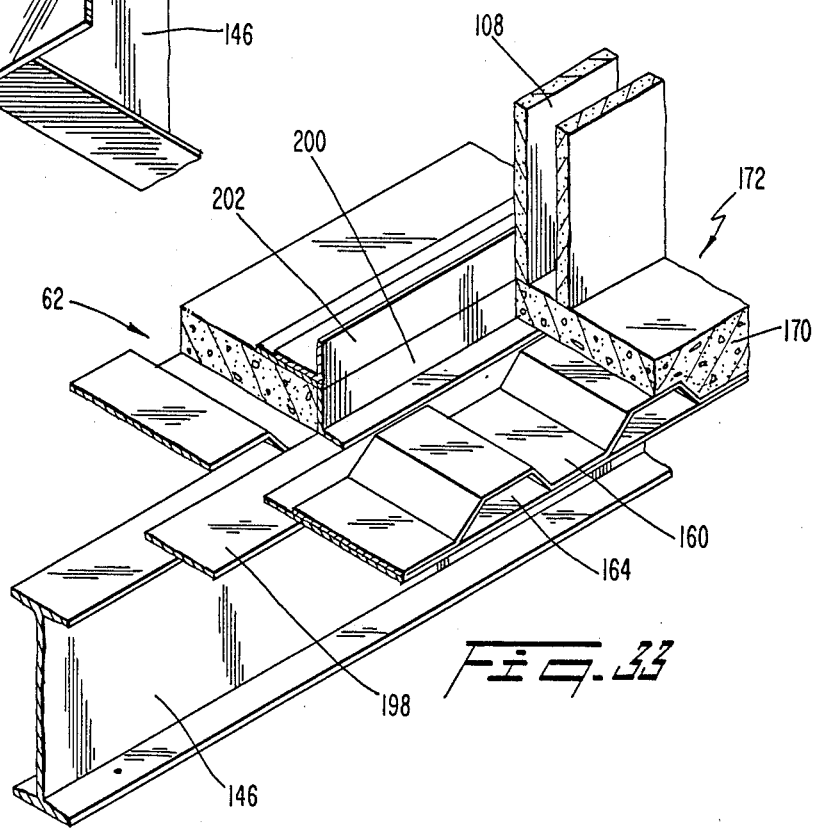

ELECTROMAGNETIC RADIATION SHIELDING ENCLOSURE AND SHIELDING COMPONENTS

BACKGROUND OF THE INVENTION

This application is a continuation of application Ser. No. 001,225, filed Jan. 6, 1987.

The present invention relates generally to structural enclosures and, more specifically to a shielding enclosure for substantially preventing the propagation of electromagnetic radiation into or out of the enclosure. The invention also relates to shielding components used to construct such a shielded enclosure.

It is known that electromagnetic waves can be shielded from propagating into or out of an enclosure that is completely and continuously surrounded by an electrically conductive material. Conventional shielded enclosures employing known concepts include metal components that are continuously welded along all abutting edges or an electrically conductive foil applied over the surface of the enclosure to be shielded.

The continuously welded shield prevents the propagation of electromagnetic waves into or out of the enclosure and possesses high attenuation level properties. However, the assembly is expensive and requires the use of specially constructed components which must be carefully welded to prevent spots of leakage therealong. Easy installation is a primary concern in this known type of assembly and the shielding is designed to be self supportive when constructed so that a shielded enclosure can be constructed in an already existing room of a larger building. This also enables short term use of the assembly since it can be removed from the building without any damage being done to the building's structure. One problem with this type of assembly is that it cannot be easily adapted to use in a multiple room enclosure within a building or to any application on a scale larger than one room. In addition, since it is designed for short term use, ease of repair of assembly parts is not designed into the assembly and such repair is expensive and difficult.

A shield comprising a metallic foil layer which covers the enclosure provides certain advantages over the continuously welded shield. For example, the foil shield is generally less expensive and easier to install than the welded shield. However, the foil shield has a very short useful life compared to the welded shield and must, therefore, be replaced more frequently. Such replacement is not complicated when the enclosure is merely the size of a single room. However, where larger multiple room enclosures are desired, the cost of frequent repair and replacement of the shield becomes almost prohibitive. The foil layer is usually stapled to the surface of a support within a room or directly to the walls of the room and operates to shield electromagnetic energy at attenuation levels much lower than the known welded shield assembly above.

A shielding enclosure providing effective security from electromagnetic radiation propagation into and out of the enclosure and possessing intermediate attenuation level properties at a cost which is favorable as compared to conventional shielding enclosures would be desirable. Further, it would be beneficial to provide shielding components made of nearly conventional materials and available at reasonable prices that allow a shielding enclosure to be constructed which includes several floors and a multitude of rooms. Such components must be easily replaceable to enable quick and inexpensive repair of defective components so as to extend the life of the enclosure.

It would also be desirable to provide a shielding enclosure which is protected from weather conditions and vandalism by an outer enclosure which surrounds accessible portions of the shielding enclosure and which is spaced from the shielded enclosure an adequate distance to enable inspection, repair and replacement of defective components from within the outer enclosure.

SUMMARY OF THE INVENTION

The present invention relates to a shielding enclosure for preventing propagation of electromagnetic radiation into or out of the enclosure and comprises a support structure and a plurality of sheets of electrically conductive material supported thereon which cover the surface area of the shielding enclosure. Each of the sheets has an edge extending therearound and a region of overlap extending inwardly of and along the edge. This region is in overlapping engagement with the regions of overlap of sheets adjacent thereto on the support structure. The overlapping regions of any two adjacent sheets define a wave guide gap having a dimension of width and depth and pressing means disposed externally of the sheets are provided to press adjacent sheets together at the overlapping regions to maintain a wave guide gap width through which the electromagnetic energy cannot propagate.

The shielding enclosure is constructed from mostly conventional components and differing means are employed to press the overlapping regions of the shielding sheets together in different areas of the enclosure. The shielded ground level floor, roof and walls each employ different components to utilize the overlapping sheet concept and to provide effective security from electromagnetic radiation leakage. In addition, a cellular deck floor is employed to shield any upper floors of the enclosure that require shielding.

An additional outer structure can be built around the shielding enclosure to protect the enclosure from weather conditions such as rain and severe temperature changes and to provide access to different areas of a multiple story enclosure so as to enable inspection, replacement and repair of defective shielding components.

BRIEF DESCRIPTION OF THE DRAWING

The many objects and advantages of the present invention will be evident from the following detailed description of a preferred embodiment of the invention. The detailed description is to be considered in cooperation with the attached drawing in which like reference numerals are used to designate similar elements in the several figures and in which:

FIG. 5 is a side sectional view of the base of a vertical column of a shielded enclosure;

FIG. 6 is a partial plan view, partly cut away, of the overlapping shielding sheet arrangement employed to shield the grade level of a shielding enclosure;

FIG. 7 is a partial perspective view of a column having a shielding collar continuously welded thereto;

FIG. 8 is a side sectional view of the shielding connecting between grade level shielding components and wall shielding components of a shielding enclosure;

FIG. 13 is a side sectional view of overlapping regions of two shielding sheets of a wall shielding arrangement;

FIG. 14 is a partial side elevational view, partly cut away, of an overlapping shielding sheet arrangement employed to shield walls of a shielding enclosure;

FIG. 15 is a side sectional view of horizontally extending overlapping regions of two shielding sheets;

FIG. 16 is a top sectional view of vertically extending overlapping regions of two shielding sheets;

FIG. 17 is a partial side elevational view, partly cut away, of a wall shielding arrangement at an intersection of the shielded wall with a perpendicularly extending beam;

FIG. 18 is a partial perspective view of components employed at the intersection shown in FIG. 17;

FIG. 19 is a top sectional view of the shielding intersection shown in FIG. 17;

FIG. 23 is a partial side sectional view of two overlapping deck section edges;

FIG. 24 is a partial side sectional view of an arrangement for connecting the end edges of deck sections to a support beam;

FIG. 25 is a partial side sectional view of a shielded floor constructed from cellular deck sections;

FIG. 26 is a partial perspective view of a column collar employed at an intersection between a shielded deck floor and a vertically extending column;

FIG. 27 is a plan view of a collar element;

FIG. 28 is a top sectional view of a collar arrangement;

FIG. 29 is a side sectional view of an intersection between a shielded deck floor and a vertically extending column;

FIG. 30 is a partial perspective view, partly cut away, of a shielding connection between a shielded deck floor and a shielded wall located beneath the deck floor;

FIG. 31 is a partial side sectional view of a shielding connection between a shielded deck floor and a wall located beneath the floor at an intersection between the connection and a beam extending through the wall;

FIG. 32 is a partial perspective view of a collar arrangement usable in the connection illustrated in FIG. 31; and FIG. 33 is a partial perspective view, partly cut away, of a shielding connection between a shielded deck floor and a shielded wall extending upwardly from the deck floor.

DETAILED DESCRIPTION OF THE PREFERRED EMBODIMENT

A general description of a building employing a shielding enclosure made in accordance with the invention will first be discussed with reference to FIGS. 1–4.

Figure 1:
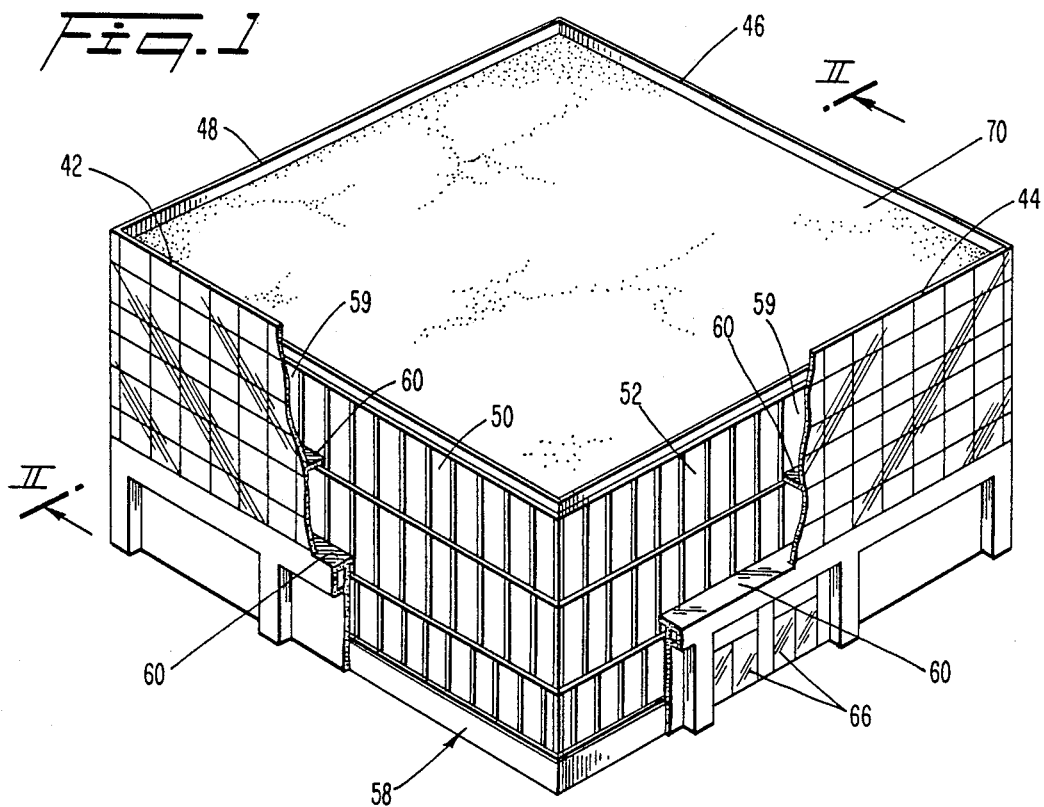
FIG. 1 is a perspective view, partially cut away, of a building including a shielding enclosure according to the invention.

As shown in FIG. 1, a building 40 has outer structural walls 42, 44, 46, 48 extending around the entire periphery thereof which are spaced from shielded walls 50, 52, 54, 56 of a shielding enclosure 58 to form an interstitial space 59 therebetween.

The shielded walls 50, 52, 54, 56 of the enclosure 58 are constructed of overlapping sheets of electrically conductive material which are secured together in a manner described below.

An access floor 60 extends around the periphery of the enclosure 58 within the interstitial space 59 at each floor thereof and provides access to the shielded walls to permit inspection, repair and replacement of any defective shielding components.

Figure 2:
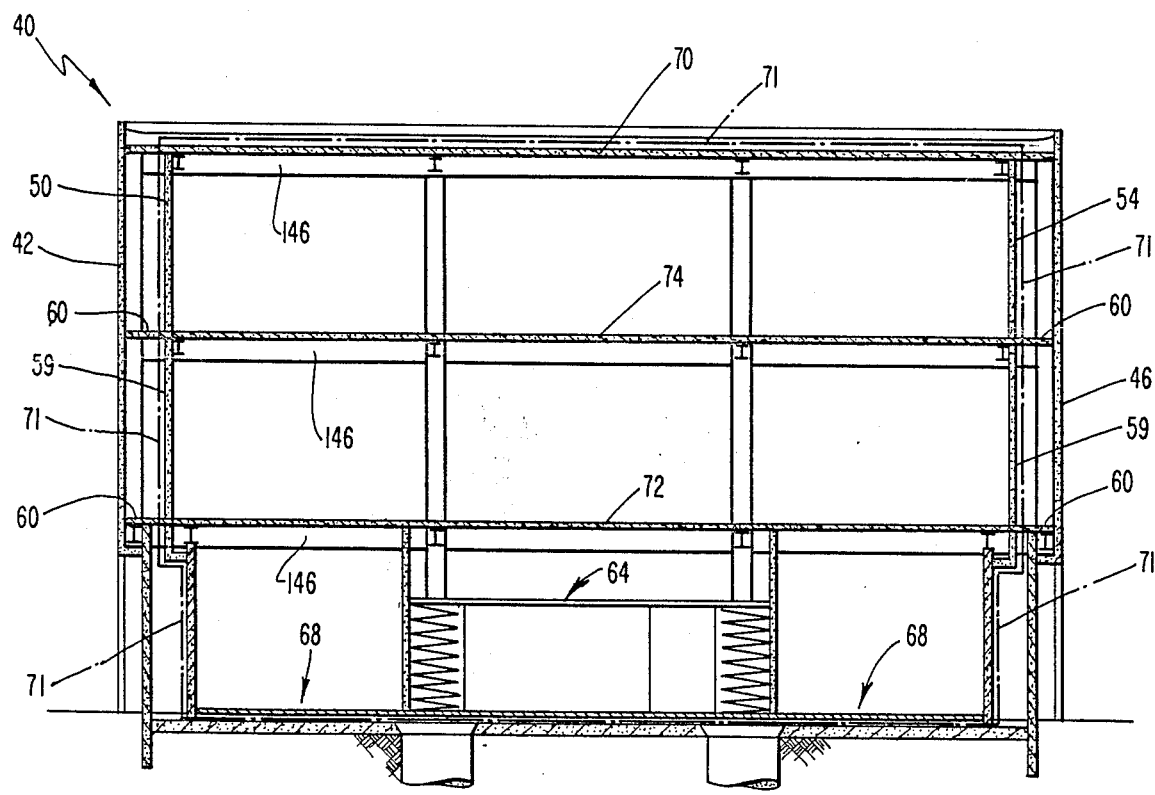
FIG. 2 is a vertical sectional view of the building of FIG. I taken along line II—II.
Figure 3:
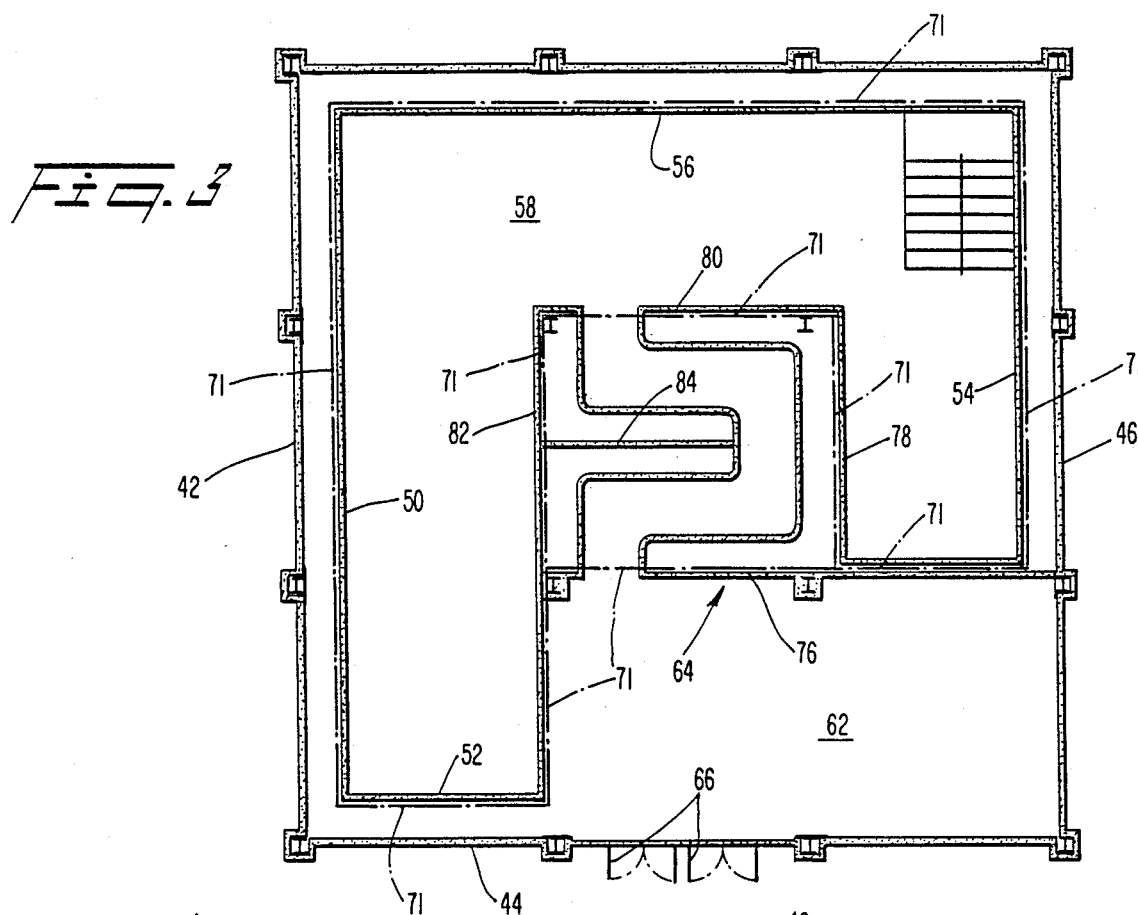
FIG. 3 is a plan view of the ground level of the building of FIG. 1.

A non-shielded area 62 depicted in FIG. 3 is provided in the building and accesses the shielded area through a specially constructed passage or shielded vestibule arrangement 64 depicted in FIGS. 2 and 3. A conventional entrance 66 provides access between the non-shielded area 62 and the outside of the building.

FIG. 2 is a vertical sectional view of the building 40 depicting that the shielded enclosure 58 extends over the entire width of the building 40 on all three floors thereof.

The ground floor 68, walls 50, 52, 54, 56, and roof 70 of the enclosure 58 are provided with shielding as discussed below and as indicated schematically along the broken line 71 shown in FIGS. 2–4. The outer walls 42, 44, 46, 48 of the building 40 are spaced from the shielded walls 50, 52, 54, 56 of the enclosure 58 and one of the access floors 60 extends along the outer side of the shielded walls 50, 52, 54, 56 at each floor of the enclosure 58. The access floors are spaced from the shielded walls a short distance (see FIG. 20) so that there are no unnecessary interruptions in the wall shielding except for beams 146 which protrude through the enclosure walls to provide support for the outer walls 42, 44, 46, 58 and access floors 60 of the building 40.

It is not necessary to shield the interior floors 72, 74 located above the shielded areas of the ground floor 68 since the upper floors 72, 74 are wholly contained within the enclosure 58. The same holds true for interior walls, not shown, of rooms completely enclosed within the shielded walls 50, 52, 54, 56 enclosure 58.

A floor plan illustrating the use of a non-shielded area 62 within the building 40 and adjacent the enclosure 58 is shown in FIG. 3. The main building entrance 66 opens into the non-shielded area 62 which includes only a portion of the first floor in the exemplary embodiment. Although the grade beneath the unshielded area 62 is not provided with shielding, the walls and ceiling between the non-shielded and shielded areas are provided with a continuous shielding so that the entire outer periphery of the enclosure 58 is shielded.

The interior of the enclosure 58 is accessible from the non-shielded area 62 through a maze arrangement 64 including a plurality of fully shielded partitions 76, 78, 80, 82, 84 covered with an anechoic absorption material, not shown. The arrangement 64 prevents leakage of radiated electromagnetic energy from within the enclosure 58. The structure of the arrangement 64 does not provide any part of the invention claimed herein and it should be understood that any known entrance which effectively shields electromagnetic energy can be used in place thereof. For example, a shielded vestibule arrangement would be employed. The maze is the preferred entrance because it permits the omission of doors and allows heavier traffic to move to and from the enclosure. This is important where the enclosure contains a large area in which many dozens of people may work. A detailed description of the entrance maze is set forth in U.S. application Ser. No. 001226 filed on Jan. 6, 1987.

Figure 4:
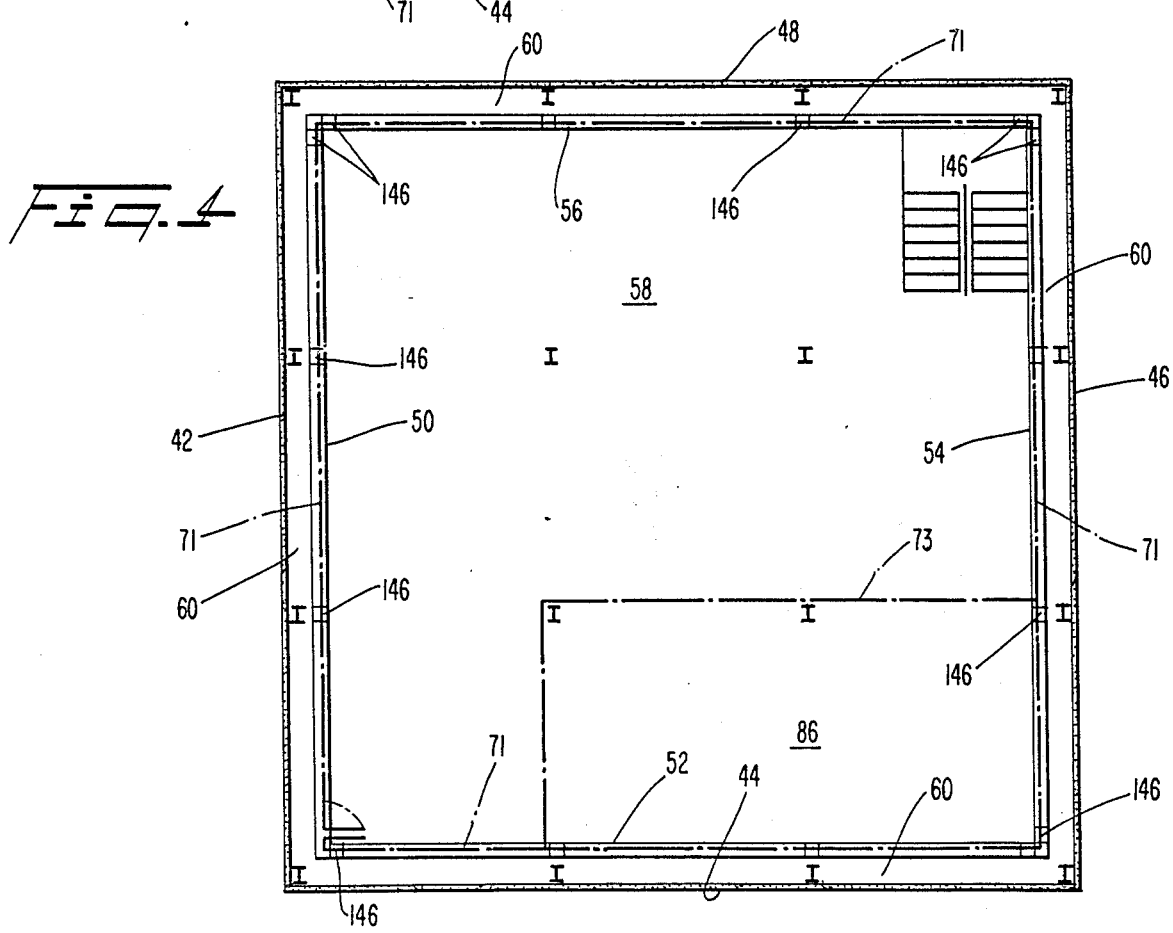
FIG. 4 is a plan view of the second floor level of the building of FIG. 1.

A plan view illustrating the second floor of the building 40 is shown in FIG. 4. As schematically shown by the broken line 71, the enclosure 58 encompasses the entire second floor. The enclosure walls, 50, 52, 54, 56 extending upwardly from the second floor are all shielded to provide continuous shielding of the entire enclosure perimeter. Since only a portion of the grade floor 68 below the second floor is shielded, some of the second floor is exposed from below the non-shielded area 62. Therefore, that portion 86 of the second floor deck extending over the non-shielded grade floor area 62 is provided with shielding and the interior walls (not shown) extending between the shielded area of the grade floor and the shielded area 86 of the second floor are also shielded. the broken line 73 depicts the deck area of the second floor that is provided with shielding.

Given the multiple storied dimensions of the shielded enclosure 58 of the preferred embodiment of the present invention, a detailed description of the shielding components used in the construction of the enclosure floors, walls and roof will now be given.

One object of the present invention is to use conventional components in providing an effectively secure enclosure. This is accomplished by employing an overlapping sheet arrangement in which a plurality of electrically conductive, metallic sheets, e.g., aluminum, steel, stainless steel, galvanized steel, copper, lead or turne metal, cover an entire area to be shielded in such a way as to effectively prevent leakage of electromagnetic radiation therethrough. The sheets are positioned so that each sheet either overlaps or is overlapped a predetermined distance by all adjacent sheets as will be described later in greater detail. The type of electrically conductive material employed, it thickness, the amount of overlap of adjacent sheets, and the spacing of fasteners used to support the sheets all depend on the energy and attenuation levels involved in any given enclosure and can be varied to provide the desired degree of security for any given application.

The overlapping regions of two adjacent sheets define a maximum gap therebetween having a width represented by the distance between the two sheets and a depth equal to the distance of overlap. Any gap which exists between the two overlapping sheets where the sheets are not pressed together can act as a wave guide for electromagnetic radiation reaching it and will allow the radiation to propagate therethrough unless the gap dimensions are small enough to cut off the propagation. These cutoff dimensions can be calculated by known methods for any frequency which is to be shielded by the enclosure in a manner known to those having ordinary skill in the art. Additionally, testing of different overlapping sheet arrangements can be conducted to determine the gap dimensions which provide a desired level of security for any given range of radiation frequencies.

In the preferred embodiment, the enclosure is designed to shield electromagnetic radiation of frequencies from 10 khz to beyond 1 Ghz at attenuation levels of greater than 60 db and as high as 100 db. It has been found by the inventors that two overlapping metal sheets even when pressed together along their regions of overlap must at least have a depth of about four inches in order for the gap to cutoff radiation waves reaching it. Therefore, any components employed in this exemplary embodiment having less than about a four inch overlap are continuously welded together to ensure that the connection between the components is secure from leakage. This is somewhat more overlap than is actually required in the preferred embodiment, which allows for some variances during construction.

In order to ensure that the gap width between all adjacent sheets is minimized, the sheets may be formed with bends adjacent their regions of overlap which permit the sheet edges to lie flush against adjacent sheets. Alternatively, the sheets can be formed of pliable metallic material such that the overlapping regions of adjacent sheets may be pressed together to effectively close the gap between the sheets. Fasteners are spaced at intervals along the overlapping regions of the shielding sheets to fasten the sheets to the support structure and to ensure a pressing fit between the sheets.

This above-described overlapping concept is employed by the invention in the construction of the ground floor, roof and walls of the enclosure. However, different overlapping arrangements are preferably employed in each. These arrangements are described separately below in addition to an arrangement for sheilding upper floors of the enclosure that require it. Separate shielding sheets in each figure will be designated by prime notations (') to distinguish the sheets in that figure.

Grade Floor Shielding

The shielding arrangement employed to shield the grade area 68 of the enclosure beneath the ground floor of the building 40 is shown in FIGS. 5-8.

As shown in FIGS. 5 and 6, the preferred arrangement includes a plurality of electrically conductive sheets 88, 88', 88'' which are attached to a conventional grade floor including a concrete slab 90. Sheets 88, 88', 88'', 88''' of a suitable electrically conductive material and of a desired thickness are laid out in an arrangement as shown in FIG. 6 such that every sheet overlaps or is overlapped by the sheets adjacent thereto by a depth D of at least twelve inches. This ensures that the depth of any gap existing between adjacent sheets will be sufficiently greater than the minimum allowable depth to ensure the shield is effectively secure when the plates are pressed together along the region of overlap.

The sheets are secured to the concrete slab 90 by any suitable type of fastener 92 such as by nails which are staggered on center and spaced to ensure a close fit between the sheets. A concrete topping 94 is poured over the shielding to complete the grade floor 68 of the enclosure 58. The topping 94 serves to protect the shielding from damage and presses the sheets 88, 88', 88''', 88'''' together along the overlapping regions thus minimizing the width of the gap between the sheets.

The sheets adjacent the perimeter of the area to be shielded are constructed to extend beyond the concrete topping 94 (see FIG. 8) to provide a contact area in which the shielded floor 68 may be continuously connected to shielded walls extending upwardly therefrom.

Additional shielding components are employed in the grade floor 68 at points where the floor is interrupted by nonshielded elements such as columns 96 (FIGS. 5 and 7). The area immediately adjacent a column 96 is shielded by a collar plate 98 made from any electrically conductive material which is compatible with the shielding sheet material. The plate 98 includes two plate halves 100, 102 as illustrated in FIG. 7 which are welded to the column 96 and to each other such that no gap exists between the column 96 and collar plate elements 100, 102. Shielding sheets 88, 88' adjacent the column 96 are cut to fit around the column 96 but are not larger than the collar plate 98. The sheets 88, 88' are laid around the column 96 so as to overlap the collar plate 98 and are fastened thereto. In the exemplary embodiment, the sheets 88, 88' are continuously welded to the collar plate 98 along the overlapping portion of the sheet edges to ensure a secure connection. However, as mentioned, it is possible to provide a larger collar plate having a sufficiently large region of overlap interacting with the adjacent sheets to provide an adequate shield without the need for having to continuously weld the sheets to the plate.

The edge of the shielded grade floor 68 adjacent the interstitial space 59 of the building 40 is shown in FIG. 8. As mentioned, each sheet 88 along the edge of the enclosure 58 extends a short distance beyond the concrete topping 94 to provide an area for connecting the floor shielding to wall shielding extending upwardly therefrom.

One edge of an L-shaped plate 104 is continuously welded along the exposed area of the floor sheets and a flange 106 of the plate 104 extends upwardly along a wall substrate 108 on which shielding sheets 110 are to be provided. The plate 104 is made from any suitable electrically conductive material such as steel so as to provide an effective shield along the connection. The plate flange 106 serves as a shielding overlap region which cooperates with the shielding sheets 110 attached to the wall substrate 108 to provide a secure connection therebetween. The specific arrangement used to secure the shielding sheets 110 to the wall substrate 108 and to the L-shaped shielding plate 104 is discussed below with reference to the wall shielding arrangement.

Roof Shielding

Figure 9:
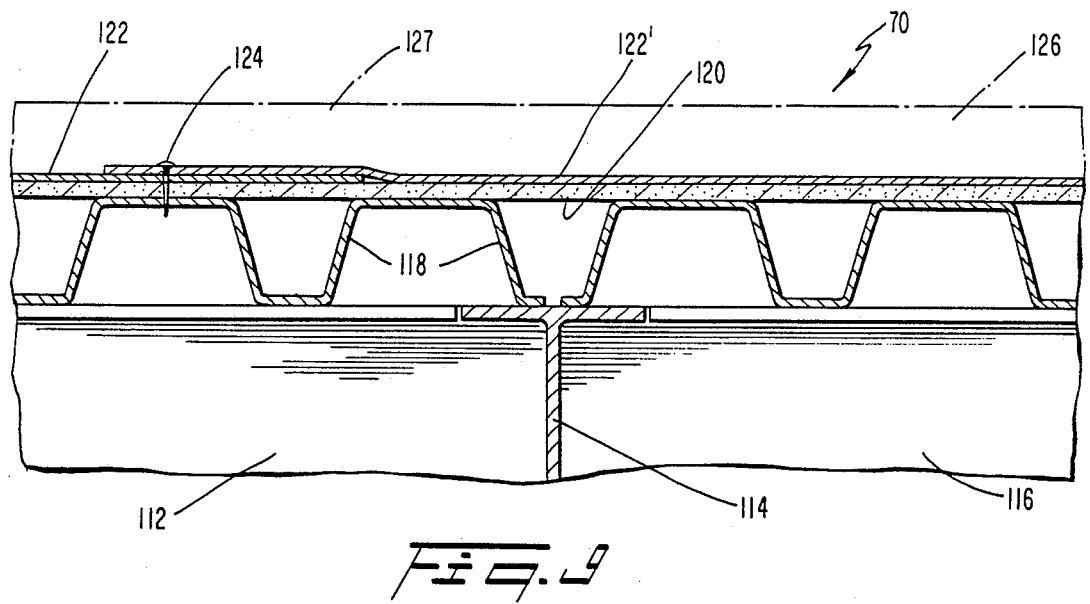
FIG. 9 is a partial side sectional view of roof shielding components.

The roof 70 of the enclosure 58 is constructed primarily of readily available conventional components. As shown in FIG. 9, the roof support beams 112, 114, 116 of the support structure are covered by a structural roof deck 118 having a corrugated cross section. A substrate 120 is laid over the support deck 118 and electrically conductive shielding sheets 122, 122' of a suitable type and thickness for the energy and attenuation levels expected are laid over the substrate 120 in an overlapping arrangement and fastened thereto by any suitable type of fastener 124 such as metal screws staggered on center and spaced to ensure a close fit between the sheets. The shielding sheets 122, 122' are then covered by conventional roofing and insulating materials 126, indicated schematically by a broken line 127 in FIGS. 9 and 12 to protect the enclosure 58 and the building 40. In addition, the weight of the shielding sheets 122, 122' and the roofing and insulation materials 126 acts to press the sheets 122, 122' together along their overlapping regions to provide a flush fit therebetween so that welding of the sheets is not necessary.

Figure 10:
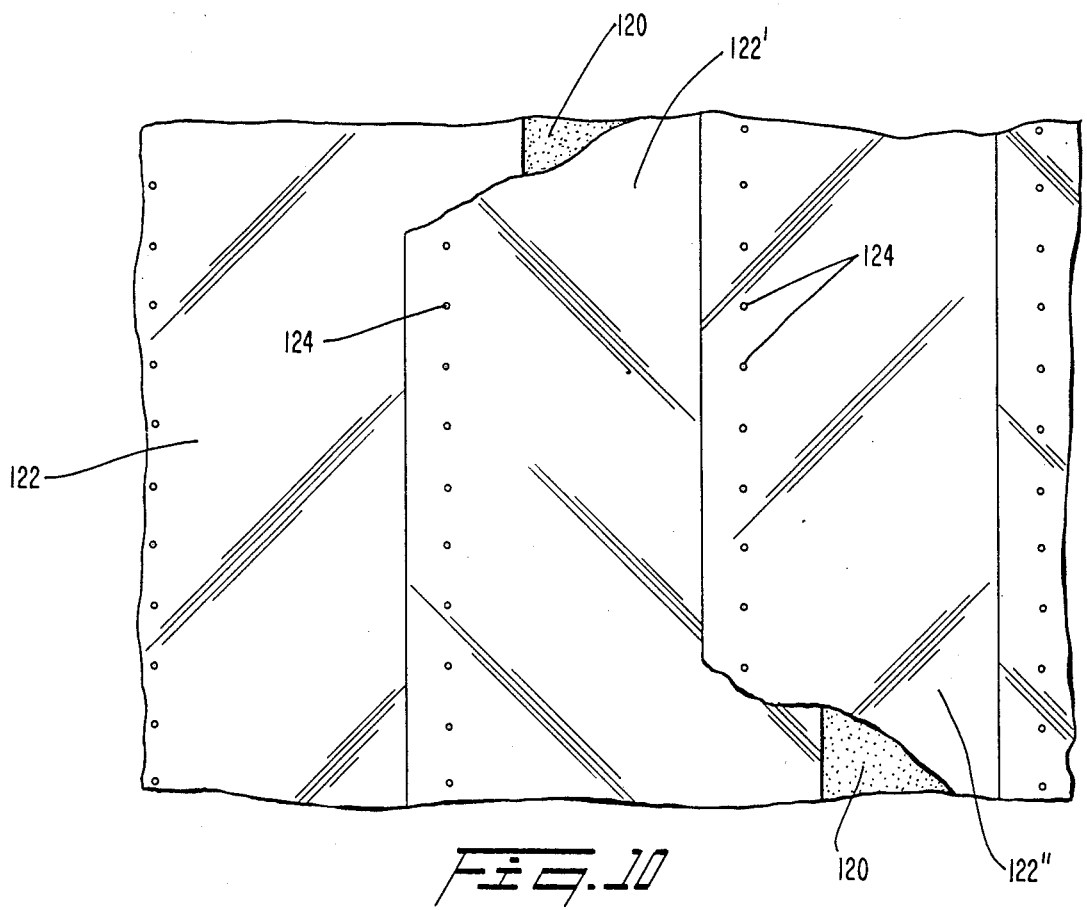
FIG. 10 is a partial plan view, partly cut away, of the overlapping shielding sheet arrangement employed to shield the roof of a shielding enclosure.

An exemplary overlapping arrangement is illustrated in FIG. 10. Although the sheet size is not critical, it is advantageous to employ as few sheets as possible in the roof and grade shielding arrangements so that the number of gaps in the shielding are minimized.

Figure 11:
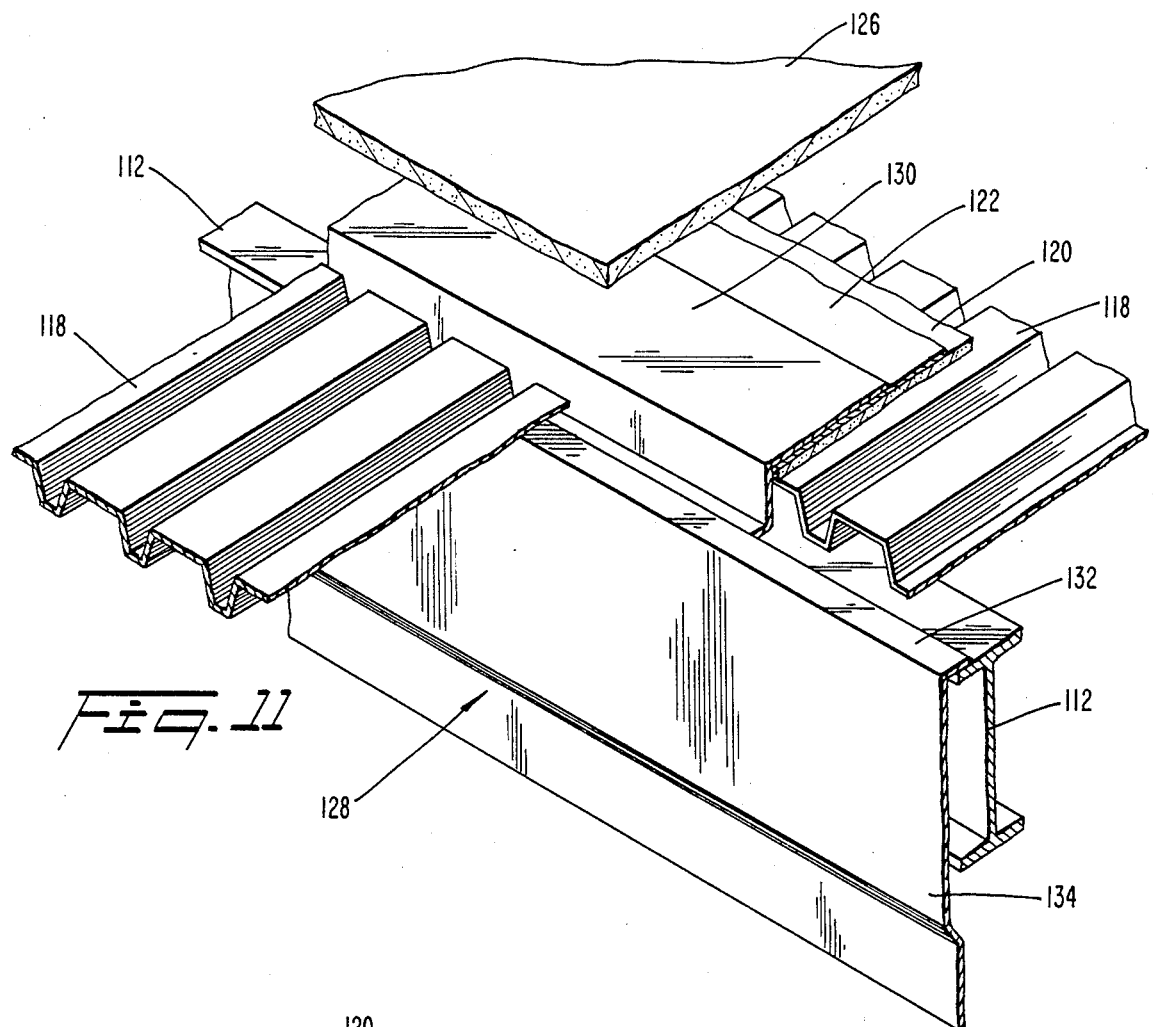
FIG. 11 is a partial perspective view of the connective between room shielding components and wall shielding components.
Figure 12:
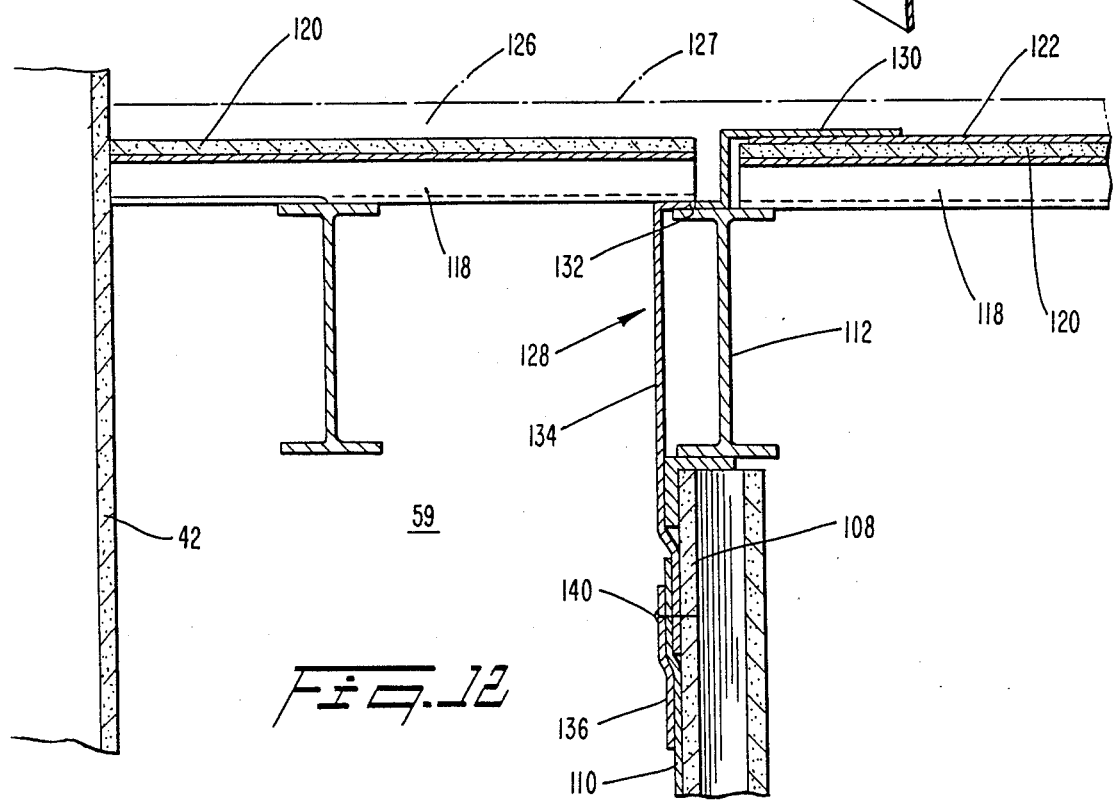
FIG. 12 is a side sectional view of the connection between roof shielding components and wall shielding components.

The connection between the roof shielding arrangement and the wall shielding arrangement is shown in FIGS. 11 and 12. The connection includes two bent shielding plates 128, 130 of any compatible electrically conductive material. These bent plates continuously extend along the support beams 112 surrounding the perimeter of the roof 70 of the enclosure 58. The lower shielding plate 128 is continuously welded along an upper edge 132 to the top surface of the perimeter beams 112 prior to construction of the roof arrangement. The upper shielding plate 130 is installed with the roof components and is continuously welded to the top surface of the perimeter beams 112 along a line adjacent to that along which the lower plate 128 was welded. The upper shielding plate 130 includes a region which overlaps the shielding sheets 122 adjacent the perimeter of the roof shielding arrangement and which is pressed against the sheets 122 by the roofing and insulation materials 126.

The lower shielding plate 128 is provided with a downwardly turned portion 134 that extends along a wall 108 of the enclosure 58 and which provides a region along the wall substrate 108 which can be overlapped by wall shielding sheets 110 in a manner to be described more fully below.

Wall Shielding

FIGS. 13–21 relate to an arrangement for shielding the walls of the shielding enclosure 58. Because gravity does not act on the vertically arranged wall shielding sheets 110, 110' to press the sheets together along their overlapping regions, pressure plates, 136, 138 are employed which support the sheets 110, 110' and constrict the gaps between adjacent sheets to ensure that leakage will not occur.

A pressure plate 136 is shown in FIG. 13 and includes a single bent, resilient plate made for example of spring steel or resilient plastic. Since the plate does not provide any part of the shield, it does not need to be made of an electrically conductive material. The only requirement is that the plates be made of a material that is electrically compatible with the material used in the shielding sheets in order to prevent galvanic corrosion problems from occurring. Several functions are served by the use of pressure plates 136, 138. A first is a support function provided by spaced fasteners 140 which extend through each pressure plate 136, 138 and the underlying shielding sheets 110, 110, and into the substrate or support structure 108. Although any conventional type of fastener 140 can be used, it is preferred to use replaceable fasteners such as metal screws. This enables the replacement of damaged or defective sheets without requiring a prohibitive amount of effort.

A second function of the pressure plates 136, 138 is to press the overlapping regions of the two underlying sheets 110, 110' together to constrict the gap therebetween to ensure that leakage does not occur. The sheets 110, 110' are preferably overlapped a distance of twelve inches in the wall arrangement to provide a secure connection between the sheets and to present a sufficiently wide bearing surface for receiving the pressure plate 136 or 138 which fastens the sheets together along that region.

A typical overlapping arrangement is illustrated in FIG. 14. The sheets 110, 110', 110''', etc., are overlapped along both the vertical and horizontal edges such that each sheet is in contact with all eight sheets adjacent thereto.

As shown in FIG. 15, the horizontally oriented pressure plates 136 press the horizontally extending overlapping regions of the sheets 110, 110' together and the fasteners 140 support the sheets on the underlying wall substrate 108 which can be made from conventional materials such as concrete or drywall. An additional support plate 142 can be employed where a structurally weak material such as dry wall is used as the substrate material. The plate 142 is attached to horizontally spaced vertical studs 144 in the support structure to provide a foundation into which the fasteners 140 can be secured.

Vertically extending pressure plates 138 extend along the vertical regions of overlap of the sheets 110, 110' and hold the sheets against the underlying wall substrate 108. As shown in FIG. 16, a vertically oriented pressure plate 138 can be fastened to vertical studs 144 underlying the support structure where drywall is used, or can be fastened directly to the wall substrate 108 when the substrate is made from a material such as concrete which can support the shielding sheets 110, 110'.

The wall shielding arrangement is periodically interrupted around the wall perimeter at each level of the support structure by beams 146 which extend perpendicularly through the wall substrate 108. Where the enclosure 58 does not have outer protective walls 42, 44, 46, 48, these beams 146 are not required.

The arrangement for providing continuous shielding around the beam 146 at its point of penetration of the wall substrate 108 is shown in FIGS. 17 and 18 and includes an electrically conductive collar plate 148 similar to the column collar plate 98 discussed with regard to the grade shielding. As illustrated in FIG. 18, the collar 148 is constructed of two collar halves 150, 152 which are formed of any electrically conductive material such as steel and which are continuously welded to the beam 146 and to each other to form a continuous shield.

Figure 20:
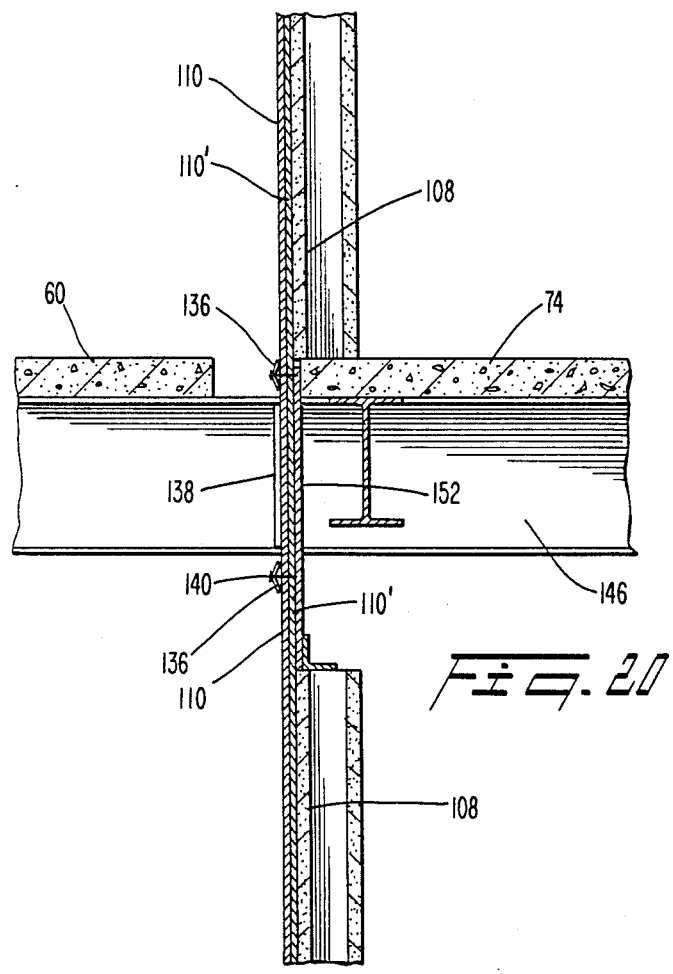
FIG. 20 is a side sectional view of an intersection between a shielded wall and a perpendicularly extending beam.

Sheets 110, 110' intersecting the beam 146 are cut to provide a three-sided notch 154 adjacent the beam 146 which has a width larger than the height of the beam 146 but smaller than the dimensions of the collar plate 148 to create an overlap between the sheets 110, 110' and the plate 148. As shown in FIGS. 19 and 20, the sheets 110, 110' on either side of the beam 146 overlap each other except along each side of the beam 146 where the notches 154, 154' are formed. Pressure plates 136, 138 and fasteners 140 are used to secure the sheets 110, 110' to the beam collar plate 148 and to constrict the gaps between the sheets 110, 110' and the plate 148. This results in a substantially continuous shielding wall at the beam 146 and prevents radiated electromagnetic energy from leaking therethrough.

Figure 21:
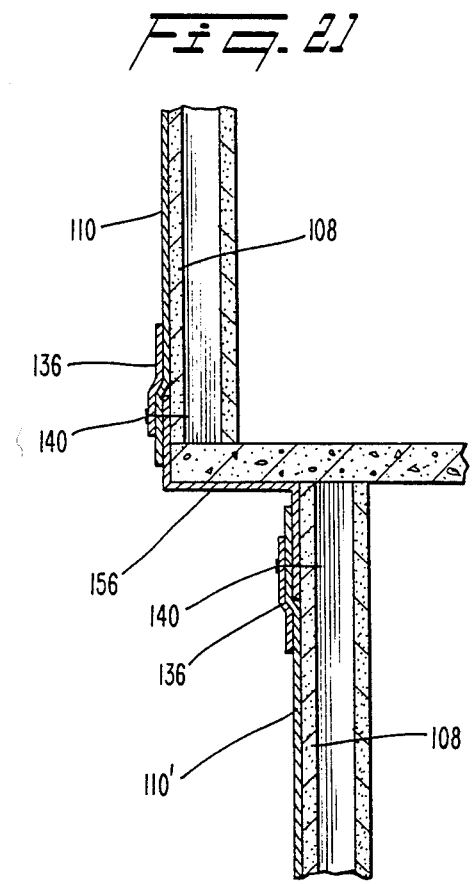
FIG. 21 is a side sectional view of a wall shielding arrangement at a horizontally extending ridge of the wall.

FIG. 21 illustrates an arrangement that is used to shield a horizontally extending ridge or cut-out in the enclosure wall 108. A bent shielding plate 156 of electrically conductive material, such as steel, is formed in the shape of the surface change and positioned along the ridge so as to provide regions of shielding overlap along the wall substrate sections 108, 108' above and beneath the ridge. Shielding sheets 110, 110' are positioned to overlap the regions and pressure plates 136 and fasteners 140 are used to secure the bent shielding plate 156 and the sheets 110, 110' to the wall substrate 108, 108' and to constrict the gap between the overlapping regions of the sheets 110, 110' and the bent plate 156.

This construction permits enclosure walls of varying shapes to be built from substantially conventional materials while providing effective security from leakage.

Cellular Deck Floors

As mentioned, none of the upper floors within the enclosure 58 are shielded since they are completely contained within the enclosure. However, if it is desired to construct an enclosure in a structure having non-shielded areas adjacent thereto, it is necessary to shield those floors of the enclosure that extend over the non-shielded space below. Therefore, an arrangement can be provided as described herein to shield such deck floors employing cellular deck sections.

Figure 22:
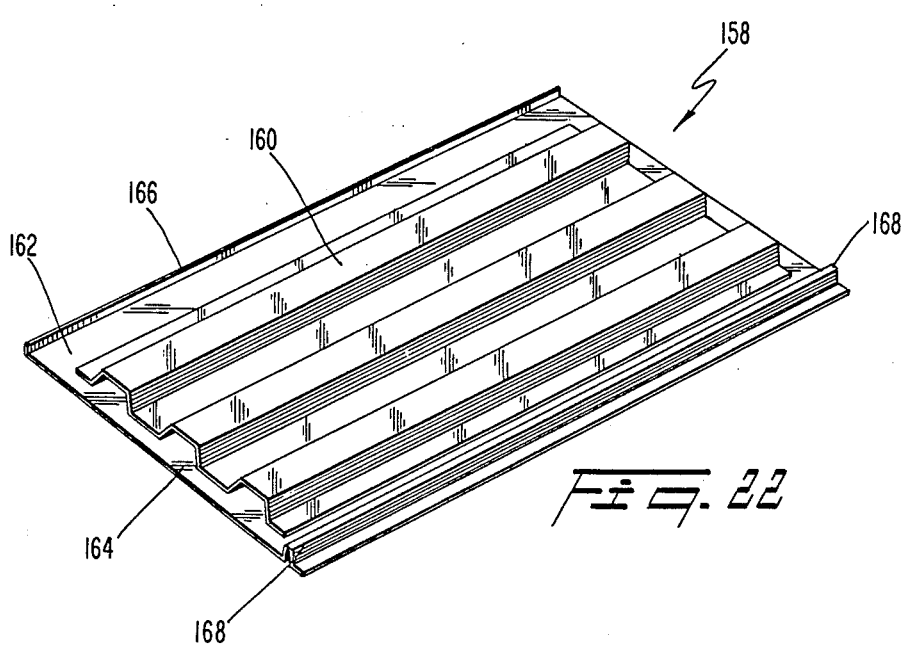
FIG. 22 is a cellular deck section shielding component.

A deck section 158 according to the invention is shown in FIG. 22 and is similar to known deck sections commonly used to construct non-shielded deck floors. Each deck section 158 includes an upper corrugated section panel 160 which is electrically fused to an upper surface 162 of a lower section panel 164. The lower section panel is made from any electrically conductive material such as steel or aluminum and acts as shielding in the completed deck. The upper section panel 16 provides structural rigidity to the section 158 so that each section will support loads typical of conventional floor decks. The lower section panel 164 is generally planer but includes a tongue 166 extending along one side edge and a groove 168 spaced from but running along the other side edge. The tongue 166 may be formed by crimping a side edge of the lower section panel 164 upwardly so that the tongue 166 extends from the plane of the lower section panel 164 to the side of the plane on which the upper section panel 160 is disposed.

Groove 168 is formed along the outer side edge of the lower panel section 164 and extends in the same direction as the tongue 166 so as to provide a mating connection for the tongue 166 of an adjacent deck section. The upper section panel 160 is connected to the center of the lower panel 164 so that the lower panel end edges and side edges extend a short distance beyond the end and side edges respectively of the upper panel 160.

The connection between two deck sections 158, 158' is shown in FIG. 23. In order to provide a continuous shield, the lower section panels 164, 164' overlap along their side edges in the area between the groove and the side edge adjacent the groove and are continuously welded at 165 along an upper exposed side edge of one of the panels 164 to ensure continuity of the shield. The tongue 166' of one of the deck sections fits within the groove 168 of the other section to position the sections relative to each other and to ensure that some overlap is provided between the sections. However, since the amount of overlap between the side edges of two sections 158, 158' in the preferred embodiment is less than about four inches, the edges should be continuously welded in order to ensure that the shielding will effectively prevent leakage. The upper section panels 160, 160' of the two deck sections 158, 158' terminate prior to the region of overlap of the lower section panels 164, 164' to permit a close fit between the lower panels.

Any area of the support structure which is to be shielded such as the area 86 depicted in FIG. 4 is provided with overlapping floor deck sections 158, 158' and the edges of the sections are continuously welded together as described. Each of the deck sections 158 extends between two support beams 146 such that each end edge of the lower panel thereof is disposed on top of one of the support beams 146 as shown in FIG. 24. These edges are continuously welded at 167 to the top surfaces of the beams 146 to provide continuity of the shield. A concrete floor 170 is poured over the completed deck structure to complete the floor construction. A completed shielded deck floor 172 including sections 158, 158' 158" is illustrated in FIG. 25.

At locations where a column 96 extends through a shielded deck floor 172, an electrically conductive column collar arrangement is employed as shown in FIG. 26 which is similar to the column collar arrangement discussed with regard to the grade shielding arrangement. A shielding collar 174 shown in FIG. 28 consisting of two collar plate halves 176, 178, one of which is shown in FIG. 27, is continuously welded to the column 96, and the plate halves 176, 178 which are formed of any electrically conductive material are continuously welded to each other to provide a continuous electrically conductive area in the vicinity of the intersection of the column 96 with the shielded deck floor 172. Each of the deck sections 158, 158' intersected by the column 96 are cut to present a notch at the beam which has a width greater than the width of the column 96 but smaller than the collar plate width. As shown in FIG. 29, an overlapping region is formed between the deck sections 158, 158' and the collar plate 174, and the edges of the lower section panels 164, 164' adjacent the plate 174 are continuously welded thereto.

The shielded floor deck 172 is connected to wall shielding 110 extending downwardly therefrom in a manner as illustrated in FIG. 30. The connection includes an L-shaped plate 180 of electrically conductive material which is continuously welded to the lower section panels 164 of the floor deck 172 along the upper edge of a wall substrate 108 intersecting the floor from below. One flange 190 of the L-shaped plate 180 extends downwardly and along the substrate 108 to provide a region of shielding overlap for engagement by wall shielding sheets 110 attached to the wall substrate 108. The region of shielding overlap is at least four inches and preferably greater than twelve inches in depth to ensure that the connection is secure from leakage. Pressure plates 136 are fastened to the sheets 110 along the region of overlap to secure the sheets 110 to the connection plate 180 and to the substrate 108 and to constrict the gap between the sheets 110 and the connection plate 180.

At locations where a beam 146 intersects the shielded deck floor-to-shielded wall connection, as shown in FIGS. 31 and 32, a shielding collar plate arrangement is again employed. The arrangement includes two L-shaped collar plate halves 192, 194 of electrically conductive material which are continuously welded to the beam 146 and each other, and a top plate 196 also formed of electrically conductive material which is continuously welded to the beam 146 and to the collar plate halves 192, 194. The shielded floor deck 172 extends over the top plate 196 to provide a continuous shield above the beam 196. Along the wall substrate 108, the shielding sheets 110, 110' are cut to permit passage of the beam 146 but to provide a region of overlap between the sheets 110, 110' and the collar plate arrangement. The L-shaped shielding plate 180, 180' along the top of the wall is continuously welded to the side edge of the L-shaped collar plate halves 192, 194 to provide a continuous connection in the vicinity of the beams 146. The top plate 196 ensures that the complex connection is secure from leakage. Pressure plates 136, 138 are used along with fasteners 140 to attach the sheets 110, 110' to the collar plate to press the sheets 110, 110' to the plate and to constrict the gap therebetween.

As shown in FIG. 33 one other type of shielding connection is possible between a cellular floor deck 172 and a shielded wall substrate 108 extending upwardly from the floor. This connection is made continuous by providing a flat shielding plate 198, a first bent shielding plate 200 and a second bent shielding plate 202 at the intersection between the floor deck 172 and an upwardly extending wall substrate 108 adjacent a non-shielded area 62. Each of the plates 198, 200, 202 is formed of electrically conductive material and is continuously welded to each adjoining plate. The flat shielding plate 198 is continuously welded between the top of the support beam 146 and the end edges of the cellular deck shielding sections 158. This creates a continuous shielding corner along the bottom edge of the wall 108 where it contacts the shielded floor 182.

As can be understood, mostly conventional materials are used in the present invention to construct an enclosure having a substantially continuous electrically conductive shell therearound to prevent the escape or entrance of electromagnetic radiation reaching the shell. In addition, the enclosure is formed by a combination of different overlapping sheet arrangements which are simple to install and which, in the wall arrangement, permit easy inspection, repair and replacement of individual sheets by providing an assembly which does not require continuous welding of each sheet to adjacent sheets.

The interstitial space 59 between the enclosure 58 and the outer walls 42, 44, 46, 48 of the building 40 also provides an important advantage in that it protects the enclosure 58 from harmful weather conditions such as rain, ice and extreme temperature changes, and permits easy inspection of the walls 50, 52, 54, 56 of the enclosure 58 from within the building 40 surrounding the enclosure.

As can be understood from this description, several advantages are derived from practicing the invention claimed herein. For example, by providing a shielding arrangement in which many of the components do not require continuous welding, a cheaper shielding enclosure can be built. Continuous welding requires special equipment and is expensive and time consuming. The present invention, however, minimizes the amount of continuous welding that is required by providing an arrangement wherein sheilding components are assembled in an overlapping arrangement and pressed together by any suitable pressing means. In addition, very few special or expensive tomponents area necessary since the invention employs many materials and elements that are conventionally available during a building's construction.

It is, of course, possible to embody the invention in other specific forms than those of the preferred embodiment described above. This may be done without departing from the essence of the invention. The preferred embodiment is merely illustrative and should not be considered restrictive in any way. The scope of the invention is embodied in the appended claims rather than in the preceding description and all variations and changes which fall within the range of the claims are intended to be embraced therein.

What is claimed is:

1. A shielding enclosure for preventing propagation of electromagnetic radiation into or out of the enclosure comprising:
   a support structure,
   a floor,
   a ceiling;
   perimeter walls;
   a plurality of sheets of electrically conductive material supported on said structure and covering said floor, ceiling and perimeter walls of said shielding enclosure, each of said sheets having an edge extending therearound and a region of overlap extending inwardly of and along said edge, said region being in overlapping engagement with the region of overlap of sheets adjacent thereto on said support structure, the overlapping regions of any two adjacent sheets defining a wave guide gap having a dimension of width and depth, and
   pressing means disposed externally of said sheets to press adjacent sheets together at the overlapping regions of overlap to maintain a wave guide gap through which the electromagnetic radiation cannot propagate.

2. The shielding enclosure according to claim 1, wherein said pressing means includes fasteners which extend through the overlapping regions of overlap of adjacent sheets and into said support structure.

3. The shielding enclosure according to claim 1, wherein said ceiling has pressing means including fasteners which are spaced from one another and which extend through said overlapping regions of overlap, and additional pressing means including roofing materials which press said sheets against said support structure.

4. The shielding enclosure according to claim 3 wherein ceiling perimeter shielding means extend between sheets supported on the ceiling and sheets supported on said perimeter wall to provide a continuous shield at the intersection between said ceiling and said perimeter wall, said ceiling perimeter shielding means having a first edge extending along said perimeter wall, a second edge extending along a perimeter of said ceiling and regions of overlap extending inwardly of and along said first and second edges, said regions being in overlapping engagement with the regions of overlap of sheets adjacent thereto, and wherein second pressing means press said sheets adjacent to said ceiling perimeter shielding means against said ceiling perimeter shielding means to maintain a wave guide gap through which the electromagnetic radiation cannot propagate.

5. The shielding enclosure according to claim 4 wherein said ceiling perimeter shielding means includes a first ceiling perimeter shielding plate continuously welded to said support structure and including said first edge of said ceiling perimeter shielding means, and a second ceiling perimeter shielding plate continuously welded to said support structure and including said second edge of said ceiling perimeter sheilding means.

6. The shielding enclosure according to claim 4, wherein said second pressing means includes fasteners which are spaced from one another and which extend through said overlapping regions of overlap and into said support structure, and pressure plates which are held by said fasteners against said sheets, said pressure plates including biasing means for pressing said overlapping regions of overlap together.

7. The shielding enclosure according to claim 1, wherein said pressing means on said floor includes fasteners which are spaced from one another and which extend through said overlapping regions of overlap and into said support structure, and additional pressing means are provided on said floor which includes a concrete floor which presses said sheets against said support structure.

8. The shielding enclosure according to claim 1, wherein floor perimeter shielding means extend between sheets supported on said floor and sheets supported on said perimeter wall to provide a continuous shield at the intersection between said floor and said perimeter wall, said floor perimeter shielding means having a first edge extending along said perimeter wall and a region of overlap extending inwardly of and along said first edge, said region being in overlapping engagement with the regions of overlap of sheets adjacent thereto, and wherein second pressing means press said sheets adjacent to said floor perimeter shielding means against said floor perimeter shielding means to maintain a wave guide gap through which the electromagnetic radiation cannot propagate.

9. The shielding enclosure according to claim 8, wherein said floor perimeter shielding means includes an L-shaped plate which is continuously welded to sheets extending along the perimeter of said floor.

10. The shielding enclosure according to claim 8, wherein said second pressing means includes fasteners which are spaced from one another and which extend through said overlapping regions of overlap and into said support structure, and pressure plates which are held by said fasteners against said sheets, said pressure plates including biasing means for pressing said overlapping regions of overlap together.

11. The shielding enclosure according to claim 1, wherein said perimeter wall has pressing means including fasteners which are spaced from one another and which extend through said overlapping regions of overlap and into said support structure, and pressure plates which are held by said fasteners against said sheets, said pressure plates including biasing means for pressing said overlapping regions of overlap together to maintain a wave guide gap through which the electromagnetic radiation cannot propagate.

12. The shielding enclosure according to claim 11, wherein each of said pressure plates is formed of a resilient material and includes a bend along a length thereof which permits deformation of said pressure plate, said deformation providing said biasing of said overlapping regions of sheets which are fastened between said pressure plate and said support structure.

13. The shielding enclosure according to claim 1, further comprising an upper deck floor to be shielded, a plurality of cellular deck shielding sections supported on said support structure and covering said upper floor, each of said shielding sections including edges and regions of overlap extending inwardly of and along said edges, said regions being in overlapping engagement with regions of overlap of sheets adjacent thereto on said support structure, and connecting means for continuously connecting adjacent shielding sections together along overlapping regions of overlap to prevent the formation of gaps through which the electromagnetic radiation could propagate.

14. The shielding enclosure according to claim 13, wherein said connecting means includes continuous welds along said overlapping regions of overlap.

15. A building having an area which is shielded to prevent propagation of electromagnetic radiation into or out of the shielded area comprising:
   a support structure including a first set of walls defining an interior area of said building and a second set of walls within said first set of walls which form a perimeter of and define a second area within said interior area;
   shielding means to shield said support area to prevent leakage of electromagnetic energy therefrom,
   access means to enable personnel access to said second area from outside said second area, and
   a passage extending around the exterior of said perimeter of said second area to enable inspection of said shielding means.

* * * * *